United States Patent [19]

Chouan et al.

[11] Patent Number: 5,356,824
[45] Date of Patent: Oct. 18, 1994

[54] PROCESS FOR THE PRODUCTION OF A THIN FILM TRANSISTOR HAVING A DOUBLE GATE AND AN OPTICAL MASK

[75] Inventors: Yannick Chouan, Louannec; Madeleine Bonnel, St Quay Perros, both of France

[73] Assignee: France Telecom Establissement Autonome de Droit Public, France

[21] Appl. No.: 22,175

[22] Filed: Feb. 25, 1993

[30] Foreign Application Priority Data

Feb. 26, 1992 [FR] France ................. 92 02219

[51] Int. Cl.$^5$ ......................................... H01L 21/265
[52] U.S. Cl. ............................... 437/41; 437/2; 437/101; 437/192; 437/235; 437/916; 148/DIG. 106
[58] Field of Search ............. 437/2, 3, 916, 944, 437/41, 101, 192, 235; 257/21, 59, 72, 911; 148/DIG. 106

[56] References Cited

U.S. PATENT DOCUMENTS

| | | | |
|---|---|---|---|
| 4,759,610 | 7/1988 | Yanagisawa | 257/59 |
| 4,818,712 | 4/1989 | Tulley | 437/944 |
| 4,929,569 | 5/1990 | Yaniv et al. | 437/3 |

FOREIGN PATENT DOCUMENTS

| | | |
|---|---|---|
| 0179915 | 5/1986 | European Pat. Off. |
| 0193759 | 9/1986 | European Pat. Off. |

OTHER PUBLICATIONS

Proceedings of the 14th International Conference on Amorphous Semiconductors-Science and Technology, 19–23, Aug. 1991, Garmisch-Partenkirchen, Germany, Y. Kaneko et al., "Back-Bias Effect on Current-Voltage Characteristics of Amorphous Silicon Thin Film Transistirs".

Meas. Sci. Technology, vol. 1, pp. 759–766, 1990, D. Daly et al., "The Manufacture of Microlenses by Melting Photoresist".

Product Bulletin, Olin Hunt, Waycoat HPR 200 Series (Date Unknown).

Proceedings of the Sid., vol. 27, No. 3, 1986, Los Angeles pp. 229–234, T. Sunata et al., "A Large-Area High-Resolution Active-Matrix Color LCD Addressed by a-Si TFT's".

Applied Physics Letters., vol. 50, No. 13, Mar. 30, 1987, New York, pp. 818–820, H. Hirai et al., "Tellurium thin-film transistor deposited on polyester film having plasma polymerized films on double-layered gate insulators".

Proceedings of the Sid., vol. 28, No. 2, 1987, Los Angeles, pp. 127–130, T. Sakai et al., "An active-matrix--addressed color LCD using a V2-TFT".

*Primary Examiner*—Olik Chaudhuri
*Assistant Examiner*—H. Jez Tsai
*Attorney, Agent, or Firm*—Pearne, Gordon, McCoy & Granger

[57] ABSTRACT

A process for the production of thin film transistor with a double gate and an optical mask consisting of depositing a conductive source and drain layer on an insulating substrate (31), producing photosensitive resin patterns fixing the location of the source and drain (34), etching the conductive layer, depositing on the structure obtained an opaque metal layer for forming the lower gate (42), carrying out thermal contraction of the resin patterns, depositing in isotropic manner a preferably a-C:H layer (39), dissolving the resin patterns, depositing a semiconductor layer (44), an insulating layer (45) and then a conductive layer (46) for producing the upper gate of the transistor and photoetching the stack formed by the conductive layer, the semiconducting layer and the insulating layer in order to fix the transistor dimensions and passivate the structure obtained with an electrical insulant (48).

10 Claims, 2 Drawing Sheets

PROCESS FOR THE PRODUCTION OF A THIN FILM TRANSISTOR HAVING A DOUBLE GATE AND AN OPTICAL MASK

BACKGROUND OF THE INVENTION

The present invention relates to a process for the production of a thin film transistor (TFT) having an optical mask. It is used in microelectronics and optoelectronics and, in particular, in the production of circuits for controlling flat liquid crystal display screens.

The invention more particularly makes it possible to produce thin film transistors based on hydrogenated amorphous silicon (a-Si:H) used in active matrix display screens. The invention also makes it possible to produce thin film transistors having a planar structure in a double gate configuration.

In an active matrix display screen, use is made of an electronic memory formed from memory points distributed over the entire surface of the screen which stores the video signal throughout the duration of the image. An electro-optical transducer is in contact with each memory point and is excited throughout the duration of the image.

In a TFT active matrix, each memory point consequently comprises a TFT and a capacitor, whose dielectric material is constituted by an electro-optical transducer (e.g. a liquid crystal).

FIG. 1 diagrammatically shows in longitudinal section a memory point of an active matrix flat screen on a glass substrate. It is possible to see a lower glass plate 2 supporting a TFT 4 and a transparent electrode 6 of ITO (indium and tin oxide) constituting one of the armatures of the capacitor and the drain 3 of the TFT.

On the plate 2 is also provided the TFT source 8, which is also made from ITO. A hydrogenated amorphous silicon layer 10 constituting the active part of the transistor is in electrical contact with the source 8 and the drain 3 of the TFT. It is covered by a silicon nitride electrical insulating layer 12 and then a metal gate 14 for controlling the transistor made from aluminum. This type of transistor is known as a "gate on top" transistor.

The display screen also has an upper glass plate 16 covered by an ITO transparent counterelectrode 18, which is covered by colored filters 20 in a color display screen. The space between the two transparent plates 2 and 16 is filled with a liquid crystal 22 forming, with the electrode 6 and the counterelectrode 18, the capacitor or image point of the display screen. This screen is illuminated from the rear or upper face with the aid of a light source 24 of the fluorescent tube type. The display is intended to be observed by an observer 26 from the front face which, in this case, is the lower face.

FIG. 1 shows that the hydrogenated amorphous silicon photoconductive material 10 of the TFT is protected from the light source 24 by the metal gate 14 of the transistor. Thus, the light flux from the light source 24 has no effect on the electrical characteristics of the TFT.

However, any light source placed on the side of the observer 26 (e.g. the sun, light source of the work station, etc.), illuminates the photoconductive material 10 across the transparent support plate 2 and the quality of the contrast of the observed image is sensitive to the luminous environment surrounding the observer. Thus, if the light is intense, a photocurrent is produced in the layer 10 reducing the screen contrast, because the $I_{on}/I_{off}$ ratio decreases, $I_{on}$ and $I_{off}$ respectively representing the current supplied by the transistor of a displayed point and an undisplayed point.

A first object of the invention is consequently to limit this effect by interposing between the photoconductive hydrogenated amorphous silicon and the glass plate an optical mask.

French Patent No. 2,638,880, which was filed in the name of the French State, describes the production of an absorbent, polyimide optical mask formed on the lower transparent plate between the transistor source and drain and below the hydrogenated amorphous silicon. This optical mask also makes it possible to obtain a planar structure.

The article by T. Sunata et al. "A large-area high-resolution active matrix color LCD addressed by a-Si TFT's", Proceedings of the Society for Information Display (SID), 27, 1986, No. 3, pp. 229–234, describes an optical mask constituted by an etched chromium layer placed between a continuous, silicon nitride passivating layer and the glass plate. The passivating layer then serves as a support for the active matrix of the screen.

This procedure requires two vacuum depositions, as well as a specific masking level in order to define the shape and location of the optical mask below the transistors. This supplementary masking level requires great alignment accuracy of the mask relative to the source and drain contact of the transistors. Therefore, this procedure is relatively complex and complicated and is, therefore, expensive.

SUMMARY OF THE INVENTION

It is an object of the present invention to provide a process for the production of a thin film transistor With double gate and optical mask making it possible to remove the disadvantages of the prior art referred to hereinbefore. This process makes it possible to produce an optical mask below the bulge of the double gate transistor, while reducing the number of masking levels and while ensuring an auto-positioning of the optical mask relative to the transistor source and drain.

The invention therefore relates to a process for the production of a thin film transistor having a lower gate and an upper gate, comprising the steps of:

a) depositing a layer of a first conductor on an electrical insulating substrate for producing the source and drain of the transistor, b) producing photosensitive resin patterns on the first conductor layer fixing the location and dimensions of the transistor source and drain, c) eliminating the areas of the first conductor layer not covered with resin, d) isotropically depositing, on the structure obtained in step c), a layer of a second conductor constituted by an opaque metal and which will form the lower gate of the transistor, e) carrying out a heat treatment on the structure obtained in step d) in order to bring about a contraction of the resin patterns, f) isotropically depositing a first electrical insulating layer on the complete structure obtained in step e), g) dissolving the resin patterns in order to eliminate the second conductor and the first insulating layer deposited on the resin patterns, h) depositing a layer of a semiconductor material on the structure obtained in step g), i) depositing a second electrical insulating layer on the semiconductor material layer, j) depositing a layer of a third conductor on the second insulating layer for producing the upper gate of the transistor, k) patterning and etching the stack of layers comprising the third conductor, the second electrical insulating layer and the semiconductor material layer in order to define the dimensions of the transistor, and l) passivating the structure obtained in step k) with a third electrical insulating layer.

This process makes it possible to produce, in a single peeling or elimination stage, an optical, opaque metal mask covered by an electrical insulant below the "bulge" of the transistor.

Thus, the process according to the invention is suitable for the use of a semiconductor having photoconductive properties such as, for example, hydrogenated amorphous silicon, optionally containing carbon and as described in French Patent No. 2,601,801. However, it is also possible to use polycrystalline silicon.

Thus, during the use of the transistor according to the invention in a display screen, the optical mask makes it possible to eliminate the photocurrent in the transistor due to ambient illumination of the screen.

It is known in the art that the photoconductive effect of hydrogenated amorphous silicon is greatly reduced when the thickness of the deposited film is very limited, typically 20 nm. Unfortunately, the gain obtained on this effect is to the detriment of the current intensity, $I_{on}$, which is limited by the small thickness of the semiconductor material.

As a result of the limitation of the photoconductive effect of a-Si:H, the optical mask according to the invention makes it possible to deposit a thicker semiconductor, typically 200 nm or more, and consequently brings about a potential gain of the current $I_{on}$.

In addition, this process only has two masking levels, namely one level for the definition of the transistor source and drain and the optical mask and another level for the definition of the upper transistor gate. Therefore, this process is compatible with the process for the production of an active matrix with two masking levels described in French Patent No. 2,571,893.

In this type of application, the insulating substrate and the first conductive material layer are made from a light-transparent material. In particular, the substrate is made from glass, silica or transparent plastic, such as polymethylmethacrylate (PMMA). In the same way, the first conductive material is made from tin and indium oxide or ITO.

The process according to the invention also permits an auto-positioning of the transistor source and drain relative to the optical mask, unlike the process described in the article by T. Sunata.

The use of this optical mask also permits a local passivation of the substrate, thus preventing the migration of ions from the substrate into the semiconductor material. Therefore, use can be made of a glass having only a mediocre quality.

In the production of a flat display screen, steps a) through c) are also used for producing conductive lines distributed in column-like manner and which serve to control the screen. In the same way, step k) is used for producing the conductive control rows or lines of the screen which are perpendicular to the columns.

Advantageously, the first and third electrical insulating layers are formed of hydrogenated amorphous carbon.

The hydrogenated amorphous carbon layers or a-C:H are obtained from a radio frequency plasma constituted solely by hydrocarbons. These hydrocarbons are constituted solely by carbon and hydrogen, such as alkanes, alkenes and alkynes.

The hydrocarbons usable in the invention are light hydrocarbons having 1 to 6 carbon atoms. They can be saturated, unsaturated or aromatic. For example, reference is made to acetylene, propadiene, ethylene, butene, methane, ethane and butane. Preference is given to the use of methane.

Moreover, a-C:H deposition takes place at ambient temperature.

In order to obtain a planar transistor structure, the opaque metal—hydrogenated amorphous carbon stack has a thickness equal to that of the first conductor layer.

As the opaque metal usable within the scope of the invention reference can be made to chromium, silver, platinum, aluminum, nickel-chromium, copper, etc. The thickness of the metal is such that the transmittance coefficient (in %) is below 0.5 and is in practice between 50 and 150 nm.

Advantageously, the opaque metal layer is deposited by magnetton cathodic sputtering. However, it is also possible to use other deposition methods, such as thermal evaporation.

The method of depositing thin films by magnetron cathodic sputtering is known and has been used for many years in different fields. This method makes it possible to obtain films of homogeneous thickness on large substrates (approximately 1 dm$^2$ or 1 m$^2$) at high deposition speeds of typically 100 to 200 nm/minute.

One of the consequences of obtaining of such high deposition rates relates to the heating of the substrate, which can reach temperatures close to 100° C.

As in the process according to the present invention, the opaque metal is deposited on a partly resin-covered substrate, the aim is to reduce to the greatest possible extent the thermal effect by supplying the magnetron at low power levels. Typically, the power level is 500 watts, i.e. approximately 10 times less than that used for deposition on a heat-insensitive substrate. Thus, deposition takes place at close to ambient temperature. For a power of 500 w and a substrate travel speed of 200 cm/minute, the deposition rate obtained is 2.5 nm/minute. Under these conditions there is no resin degradation. In more general terms, within the scope of the invention a magnetron power of 300 to 700 w is used.

According to the present invention, there is a thermal treatment stage for contracting the resin patterns. This treatment makes it possible to adapt the profile of the resin patterns produced according to a photolithographic method. This procedure is, in particular, described in "The manufacture of microlenses by melting photoresist" by D. Daly, Meas. Sci. Technol. 1, 1990, pp. 759–766.

The thermal treatment according to the invention makes it possible to control the contraction of the resin patterns in order to displace the perpendicular thereof relative to the base of the first etched material studs or members. This heat treatment can consist of heating in the oven at a temperature of between about 100° to 200° C. and, preferably, between about 130° to 170° C. for 15 to 40 minutes.

BRIEF DESCRIPTION OF THE DRAWING FIGURES

The invention is described in greater detail hereinafter relative to non-limitative embodiments and the attached drawings, wherein show:

FIG. 1—Diagrammatically and in longitudinal section a memory point of a flat liquid crystal screen;

FIGS. 2a to 2h—Diagrammatically and in section the different stages of the production of a transistor according to the present invention;

FIG. 3—The transfer characteristics of the transistor obtained according to the process of the present invention, i.e. the variations of the drain current $I_D$ as a function of the gate voltage $V_a$; and FIG. 4—The variations of the drain—source current as a function of the voltage applied between the drain and the source for different gate voltages, i.e. the characteristics $I_{DS}=f(V_{DS})$.

DETAILED DESCRIPTION OF THE PREFERRED EMBODIMENT

With reference to FIGS. 2a to 2h, a description will be given hereinafter of a double gate thin film transistor usable in flat liquid crystal display screens.

Figure 2A:
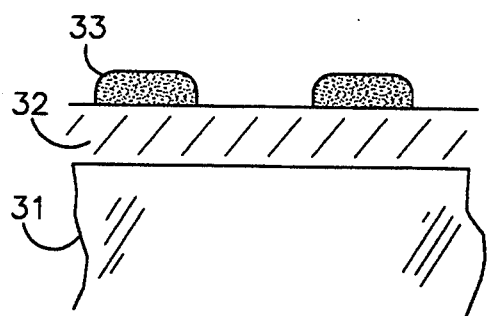

As shown in FIG. 2a, deposition firstly takes place on a transparent glass substrate 31 of a 25 to 225 nm thick transparent metal oxide layer 32. This layer is, for example, ITO deposited by vacuum magnetron sputtering.

On the ITO layer 32 is formed a first photosensitive resin mask 33, which is irradiated across a mechanical mask (not shown) defining the patterns to be etched in the ITO layer, followed by the development thereof. In particular, the resin mask 33 obtained masks the location of the source and drain of the transistor to be produced.

Figure 2E:
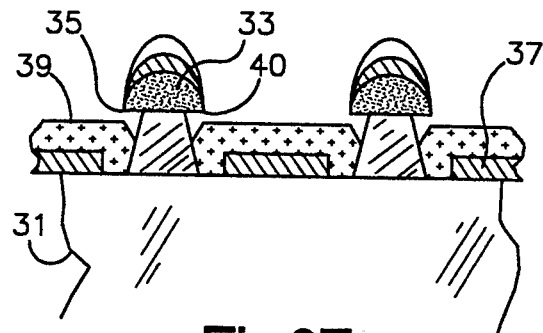
Figure 2B:
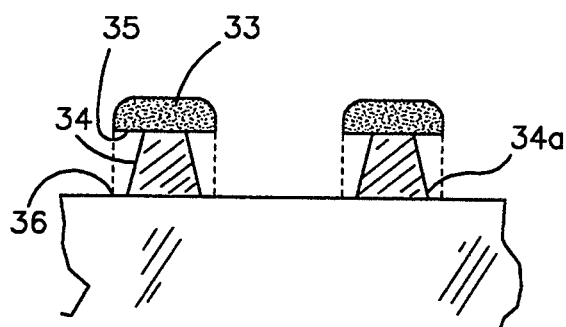

In the manner shown in FIG. 2b, this is followed by the etching of the metal oxide layer 32 by spraying or in a hydrochloric acid bath. Etching is controlled with respect to the etching agent concentration, the temperature, and the etching time in order to obtain ITO patterns 34 with inclined sides 34a. In particular, said etching is carried out with a bath containing 37% hydrochloric acid diluted to 50% in water and heated to approximately 55° C.

The inclined sides 34a of the patterns 34 make it possible to free a resin border 35 at the ITO/resin interface. The patterns 34 obtained respectively constitute the source and drain of the transistor.

The etching of the ITO layer is such that the base of each oxide stud 34 is set back with respect to the perpendicular 36 of the resin patterns 33, as illustrated.

Figure 2F:
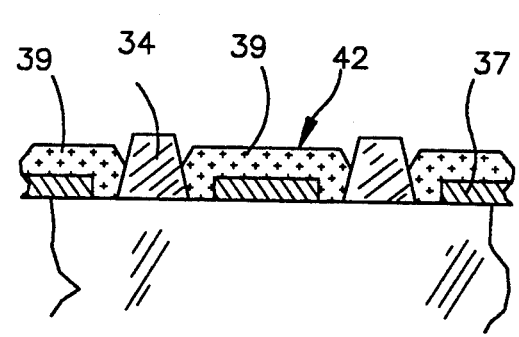
Figure 2C:
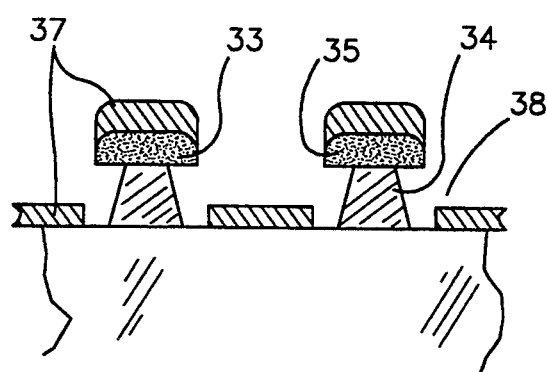

This is followed, in the manner shown in FIG. 2c, by an isotropic deposition at ambient temperature of a layer 37 of an opaque metal, such as chromium, on the complete substrate. This deposit has a thickness of 50 to 150 nm and is carried out by magnetron cathodic sputtering with a power of 500 w and a substrate travel speed of 200 cm/minute.

The isotropy of the deposit leads to the formation of metal both on the substrate 31 which has been bared and on the resin patterns 33. This isotropic deposit more particularly leads to the formation of a film, which is discontinuous between the resin patterns 33 and the substrate 31, said discontinuities carrying the reference 38.

Thus, the resin border 35 is retained, so that any shortcircuit between the metal oxide studs 34 and the metal 37 on the surface of the substrate 31 is prevented.

This is followed by a treatment of the structure obtained in order to bring about a contraction of the resin studs 33. The resin obtained after the heat treatment is shown in FIG. 2d.

This heat treatment consists of annealing in an oven at 150° C for 30 minutes. The contraction is such that the perpendicular 36 of the resin is now located on the inclined sides 34a of the ITO studs 34 and not at the base of the studs, as illustrated.

In the manner shown in FIG. 2e, this is followed by an isotropic deposition at ambient temperature of a layer 39 preferably of hydrogenated amorphous carbon and this takes place on the complete structure. This layer 39 is 10 to 150 nm thick and is typically 100 nm. Silicon nitride can optionally be used.

The isotropy of the deposit leads to the formation of a discontinuous a-C:H film between the annealed resin patterns 33 and the substrate 31. The discontinuities carry the reference 40. Thus, the border 35 of the resin patterns 33 is retained.

The hydrogenated amorphous carbon deposit is produced using pure methane at a pressure of 0.133 Pa and a flow rate of 20 cm$^2$/min. This deposit is made with a radiofrequency plasma and a self-bias voltage of the substrate 31 of 10 V.

Under these conditions, the a-C:H film obtained has a resistivity of approximately $10^{12}$ to $10^{13}$ ohms-cm.

The peeling or elimination of the amorphous carbon layer takes place without any problem by dissolving the resin patterns 33 from the visible border 35 using acetone or a solvent conventionally used in microelectronics and known as "posistrip". Thus, only the carbon 39 and the opaque metal 37 deposited on the glass substrate 31 are retained, as shown in FIG. 2f.

This gives an optical mask 42 constituted by opaque metal between the ITO studs 34 respectively of the source and the drain. Outside the transistor, the metal 37 serves as a protective material for the substrate 31.

The opaque metal studs 37 are encapsulated in a-C:H. In particular, a-C:H is placed between the opaque metal 37, specifically the optical mask, and the ITO studs 34 of the transistor source and drain. In addition, the optical mask 42 constitutes a lower gate for the transistor, which is insulated from the source and drain.

By adapting the thicknesses of the opaque metal 37 and the electrical insulant 39, it is possible to obtain a planar structure. In this case, the transistor source and drain contacts have a thickness equal to or close to that of the stack constituted by the optical mask 42 and the amorphous carbon 39.

Figure 2G:
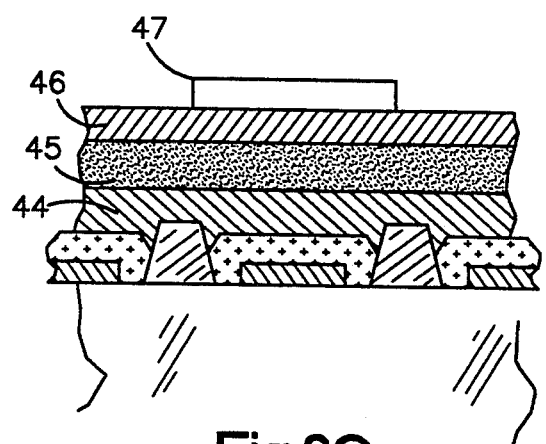
Figure 2D:
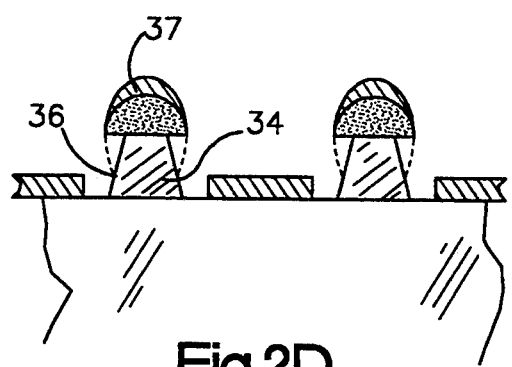
Figure 2H:
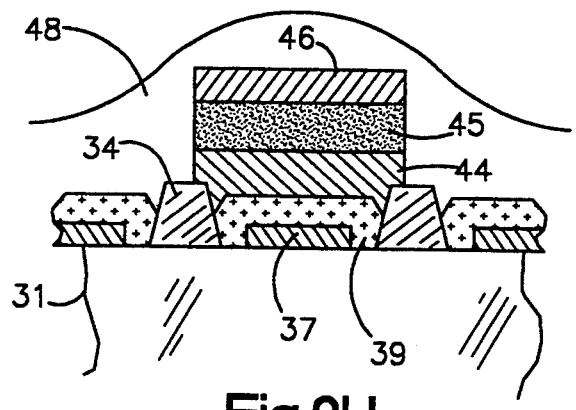

As shown in FIG. 2g, production of the transistor continues with the deposition on the complete structure of a 50 to 200 nm thick hydrogenated amorphous silicon layer, followed by the deposition of an insulating layer 45, particularly of 200 to 400 nm thick silicon nitride, and then a metallic aluminum or aluminum silicide layer 46 with a thickness of 150 to 250 nm.

These layers 44, 45, 46 have a thickness of typically 100 nm, 300 nm and 200 nm.

The layers 44 and 45 are deposited by the plasma assisted chemical vapor deposition method and the layer 46 is deposited by vacuum evaporation or preferably cathodic sputtering.

This is followed by the definition of the dimensions of the transistor with the aid of a second resin photomask 47 obtained by conventional photolithography processes (irradiation through a mask, followed by development). The mask 47 masks the underlying layers between the ITO studs 34.

This is followed by anisotropic etching by the wet route of the layer 46 and then by the dry route of the layers 45 and 44, in order to eliminate those parts of the said layers not masked by the resin 47. The etching agents are respectively a $SF_6$ plasma for the amorphous silicon and silicon nitride and an orthophosphoric acid bath for the aluminum layer.

Following the elimination of the resin photomask 47 by the wet route, the complete structure is passivated by the deposition of an electrical insulating layer 48 on the complete structure. This layer 48 is a-C:H layer deposited under the same conditions as the layer 39, or a silicon nitride layer deposited by LPCVD and having a thickness of 400 to 600 nm.

The process of optical masking and planarizing the source and drain contacts of the transistor does not require supplementary masking levels compared with the known processes having two production levels for said transistors. Therefore, this process is compatible with the process for the production of an active matrix display screen described in French Patent No. 2,571,893.

The process for the production of a metallic optical mask has therefore been integrated into the production of field effect transistors for the control of flat liquid crystal screens.

Under these conditions, the resin mask 33 also serves to produce the control columns of the active matrix in the ITO layer 32 and the mask 47 is used for producing the control rows of the matrix in the metal layer 46.

Figure 1:
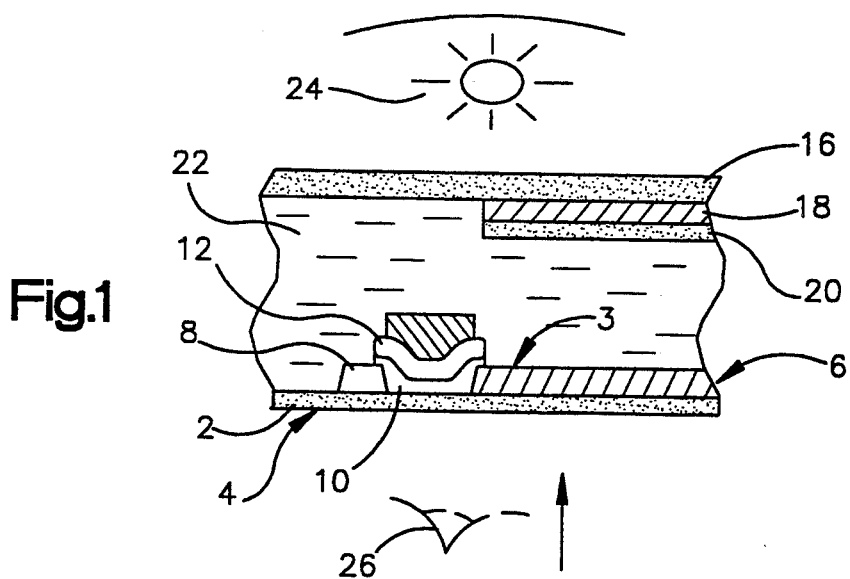
Figure 3:
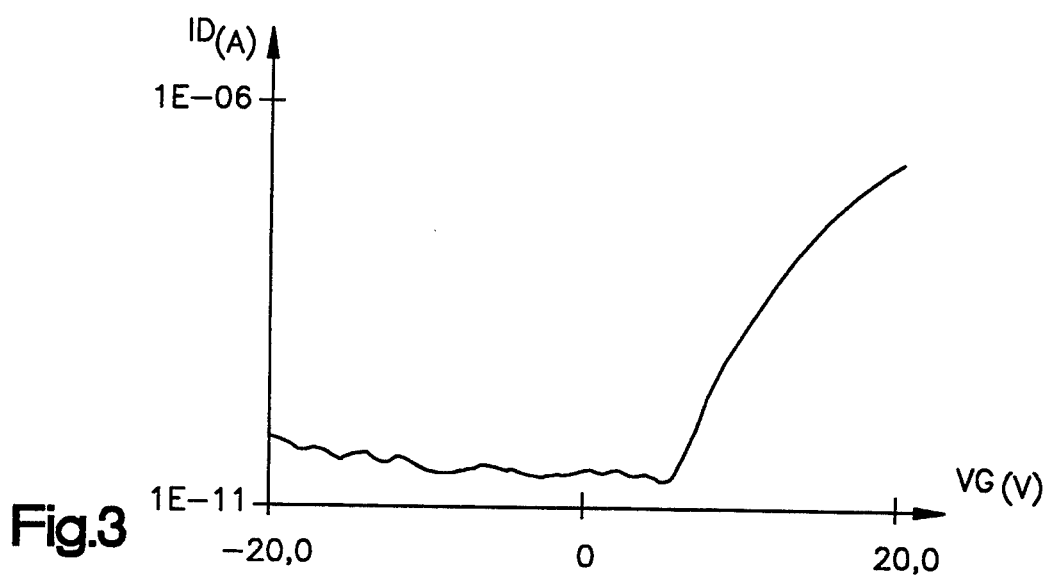

FIG. 3 gives the transfer characteristics of the transistors obtained and therefore the variations of the drain current $I_D$, in amperes, as a function of the voltage $V_a$, in volts, applied to the upper gate 46 of the transistors.

Figure 4:
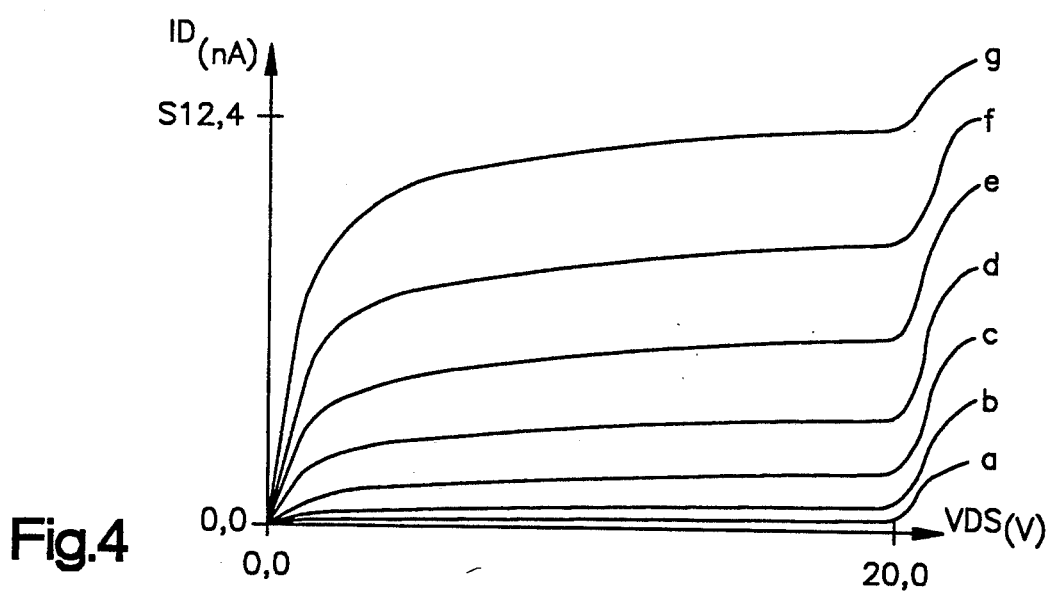

FIG. 4 gives the characteristics of the drain—source current $I_{DS}$ as a function of the voltage applied between the drain and the source $V_{DS}$ for different gate voltages $V_a$ applied to the upper gate 46 of the transistors. The current $I_{DS}$ is in nanoamperes and the voltage $V_a$ in volts. The curves a through g, respectively, correspond to a gate voltage of 10 to 24 volts.

These characteristics demonstrate the validity of the process according to the invention and are representative of all the measurements performed with the aid of a test bench under natural luminous environmental conditions.

Moreover, optical absorption measurements were carried out on chromium films of increasing thicknesses. These measurements show a quasi-total absorption for films with a thickness of 100 nm.

The following table gives the transmittance values measured for different chromium thicknesses and while illuminating with a wavelength of 500 nm.

| THICKNESS (nm) | 100 | 75 | 50 | 37 | 25 | 12 |
|---|---|---|---|---|---|---|
| TRANSMITTANCE (in %) | $10^{-5}$ | 0.05 | 0.43 | 1.38 | 3.86 | 13.96 |

Moreover, by applying an electrical polarization to the metal mask 42, the inventors have demonstrated that it was possible to modulate the current $I_{on}$ of the transistor. Thus, by polarizing the optical mask, a double gate transistor structure is obtained which is defined, on the one hand, by the metal mask 42 and the hydrogenated amorphous carbon 39 and, on the other hand, by the silicon nitride deposit 45 associated with the metal 46 forming the conventional gate.

The operation of such structures has already formed the subject matter of research, but a thin film transistor has never been produced hitherto with two masking levels. Reference can be made in this connection to "Back-bias effect on current-voltage characteristics of amorphous silicon thin film transistors" by Y. Kaneto et al., International Conference on Amorphous Semiconductors, Aug. 19–23, 1991, Garmisch-Partenkirchen, Germany.

The voltages applied to the lower gate are independent of those applied to the upper gate. These voltages are d.c. voltages, which are applied to the transistors of the display screen throughout the display of the corresponding image points.

We claim:

1. Process for the production of a thin film transistor having a lower gate and an upper gate, comprising the steps of:

a) depositing a layer of a first conductor on an electrical insulating substrate (31) for producing the source and drain (34) of the transistor, b) producing photosensitive resin patterns (33) on the first conductor layer for fixing the location and dimensions of the transistor source and drain, c) eliminating areas of the first conductor layer which are not covered with resin, d) isotropically depositing on the structure obtained in step c) a layer (37) of a second conductor constituted by an opaque metal and which will form the lower gate of the transistor, e) carrying out a heat treatment on the structure obtained in step d) in order to bring about a contraction of the resin patterns, f) isotropically depositing a first electrical insulating layer (39) on the complete structure obtained in step e), g) dissolving the resin patterns in order to eliminate the second conductor and the first insulating layer deposited on the resin patterns, h) depositing a layer (44) of a semiconductor material on the structure obtained in step g), i) depositing a second electrical insulating layer (45) on the semiconductor layer, j) depositing a layer (46) of a third conductor on the second insulating layer for producing the upper gate of the transistor, k) patterning and etching the stack of layers comprising the third conductor layer, the second electrical insulating layer and the semiconductor material layer in order to define the dimensions of the transistor, and l) passivating the structure obtained in step k) with a third electrical insulating layer (48).

2. Process according to claim 1, wherein the first electrical insulating layer (39) is of hydrogenated amorphous carbon.

3. Process according to claim 1, wherein the second conductor layer (37) is of chromium.

4. Process according to claim 3, wherein the second conductor layer (37) has a thickness of 50 to 150 nm.

5. Process according to claim 1, wherein the third electrical insulating layer (48) is of hydrogenated amorphous carbon.

6. Process according to claim 1, wherein the second conductor layer (37) and the first electrical insulating layer (39) in stacked form have a thickness equal to that of the first conductor layer (32).

7. Process according to claim 1, wherein the second conductor layer (37) is deposited at ambient temperature by magnetron cathodic sputtering.

8. Process according to claims 2 or 5, wherein the hydrogenated amorphous carbon (39) is deposited at ambient temperature by a radiofrequency plasma of pure hydrocarbon.

9. Process according to claim 1, wherein the heat treatment consists of heating the structure obtained in step d) to a temperature of 130° to 170° C. for 15 to 40 minutes.

10. Process according to claim 1 wherein the first conductor layer (32) and the substrate (31) are transparent.

* * * * *